United States Patent [19]

Liu

[11] Patent Number: 6,140,705
[45] Date of Patent: Oct. 31, 2000

[54] SELF-ALIGNED CONTACT THROUGH A CONDUCTING LAYER

[75] Inventor: Jiann Liu, Irving, Tex.

[73] Assignee: Texas Instruments Incorporated, Dallas, Tex.

[21] Appl. No.: 08/367,644

[22] Filed: Jan. 3, 1995

[51] Int. Cl.[7] ............................................. H01L 23/48
[52] U.S. Cl. ........................ 257/774; 257/758; 257/773
[58] Field of Search .................................. 257/758, 773, 257/774, 306–310

[56] References Cited

U.S. PATENT DOCUMENTS

| | | | |
|---|---|---|---|
| 4,985,718 | 1/1991 | Ishijima | 257/306 |
| 5,126,810 | 6/1992 | Gotou | 257/306 |
| 5,204,286 | 4/1993 | Doan | 257/752 |
| 5,262,352 | 11/1993 | Woo et al. | 437/189 |
| 5,500,544 | 3/1996 | Park et al. | 257/296 |

FOREIGN PATENT DOCUMENTS

| | | | |
|---|---|---|---|
| 0239647 | 9/1990 | Japan | 257/773 |
| 0062870 | 2/1992 | Japan | 257/774 |

*Primary Examiner*—Carl Whitehead, Jr.
*Assistant Examiner*—Jeff Vockrodt
*Attorney, Agent, or Firm*—Carlton H. Hoel; W. James Brady; Frederick J. Telecky, Jr.

[57] ABSTRACT

A contact hole (32) is formed through a conducting layer (28). The conducting layer (28) is then undercut (34 and 36). An insulating layer (40) is formed in the contact hole (32). A contact (42) is then formed within the contact hole (32).

3 Claims, 3 Drawing Sheets

SELF-ALIGNED CONTACT THROUGH A CONDUCTING LAYER

TECHNICAL FIELD OF THE INVENTION

This invention relates generally to the field of semiconductor processing, and more particularly to a self-aligned contact with an undercut conducting layer and method of forming.

BACKGROUND OF THE INVENTION

In the field of semiconductor technology there is an ever pressing need to increase the density of devices in integrated circuits. For example, a particular area in which increased device density is very important is that of memory devices. With memory devices, such as random access memory ("RAM"), dynamic random access memory ("DRAM"), read-only memory ("ROM"), programmable read-only memory ("PROM"), electrically erasable programmable read-only memory ("EEPROM"), and other types of memory, memory cells are arranged in arrays. By increasing the density of these memory cells, the array size, and therefore the amount of memory storage, is increased.

One limitation in increasing device density arises when contacts are needed from certain layers down to other layers. Because such contacts pass down through various layers, they must be carefully aligned to avoid interference with adjacent devices or conducting layers. These adjacent devices and conducting layers are formed to be spaced apart from the contact. However, if misalignment occurs when forming the contact, there can be short-circuiting and other device failures. To avoid these problems, existing designs allow sufficient room between various structures so that less than perfect alignment does not result in yield loss.

For example, in DRAM design, the spacing between certain contacts and adjacent structures is one of the most important parameters in determining the layout rules which will dictate the memory density of the DRAM. If a large space is chosen between a contact and an adjacent device in the design rules, the functional density of the chip goes down, and makes it less valuable. On the other hand, choosing a narrow space around contacts can cause device failure and yield loss, because of misalignment.

SUMMARY OF THE INVENTION

Therefore, a need has arisen for a device and process that will allow narrow spacing around contacts yet which will reduce or eliminate device failure and yield loss generally associated with such narrow spacing. In accordance with the teachings of the present invention, a self-aligned contact with an undercut conducting layer and method of forming is provided which substantially reduce or eliminate these prior art problems.

In particular, a semiconductor device and method are provided in which a semiconductor substrate and a conducting layer overlying the substrate are provided. A contact hole is formed through the conducting layer, and the conducting layer is undercut at the contact hole. An insulating layer is formed in the contact hole to insulate the conducting layer, and a contact is formed in the contact hole. In a particular embodiment, the contact provides electrical connection to a DRAM cell.

An important technical advantage of the present invention is the fact that a contact hole is formed through a conducting layer. Thus, the contact hole and subsequent contact are self-aligned with the conducting layer. This self-alignment avoids alignment problems that occur when trying to locate a contact hole through a patterned and etched conducting layer.

Another important technical advantage of the present invention is the fact that the conducting layer is undercut at the contact hole, thereby allowing for sufficient insulation to be disposed between the contact hole and the conducting layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
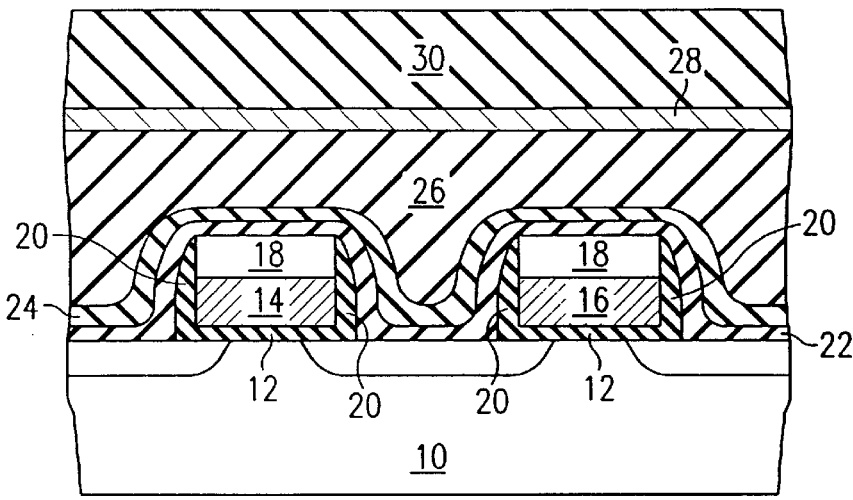
FIG. 1 illustrates a semiconductor stack with an etch stop layer for subsequent processing according to the teachings of the present invention.

FIG. 1 illustrates a semiconductor stack during processing. The particular stack shown in FIG. 1 is exemplary only and is presented to illustrate the present invention. It should be understood that the other semiconductor stacks, with different conductors, insulators, and features may take advantage of the present invention without departing from the intended scope herein.

As shown in FIG. 1, a semiconductor substrate 10, which may comprise silicon, for example, is provided. A layer of oxide 12 separates substrate 10 from gates 14 and 16, which have been formed by patterning and etching. Gates 14 and 16 may be formed from polysilicon. Overlying gates 14 and 16 is patterned and etched oxide layer 18. The oxide layer 18 and gates 14 and 16 are surrounded by side wall oxide 20. Oxide layer 20 may be formed of, for example, silicon dioxide. An optimal layer 22 of silicon dioxide is then formed overlying the oxide layer 18 and side wall 20 as shown in FIG. 1. Overlying the oxide layer 22 is a nitride layer 24. The nitride layer 24 will serve as an etch stop for the formation of a self-aligned contact hole to be discussed below. Other etch stop materials may also be used.

A layer 26 of boron phosphorous glass ("BPSG") is then formed as shown in FIG. 1. A conducting layer 28 is formed overlying BPSG layer 26. Conducting layer 28 may be polysilicon. Another BPSG layer 30 is then formed overlying conducting layer 28.

It should be understood that the particular layers shown in FIG. 1 are exemplary only, and will be used to explain how the self-aligned contact of the present invention can be used to reduce layout area and increase functional density. The layers shown in FIG. 1 may be formed with conventional semiconductor processing techniques.

Figure 2:
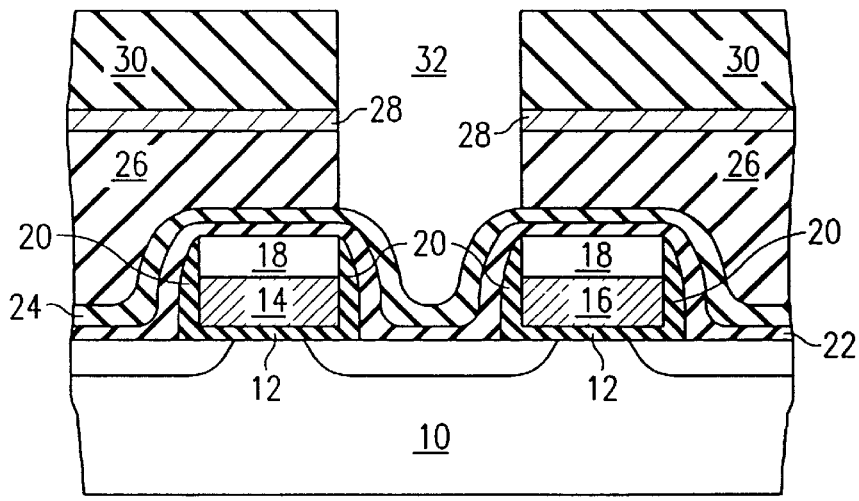
FIG. 2 illustrates a self-aligned contact hole according to the teachings of the present invention.

As shown in FIG. 2, a contact hole 32 is formed by patterning and etching the stack shown in FIG. 1. The etch used to form contact hole 32 has a high selectivity to the etch stop layer 24, which as discussed above may be a nitride layer. In the example where the etch stop is a nitride layer, the etch used to form contact hole 32 may be an oxide etch with high selectivity to nitride.

As seen in FIGS. 1 and 2, no patterning of the conducting layer 28 is necessary to make room for the contact hole 32. Rather, with the present invention, contact hole 32 is formed directly through conducting layer 28.

Figure 3:
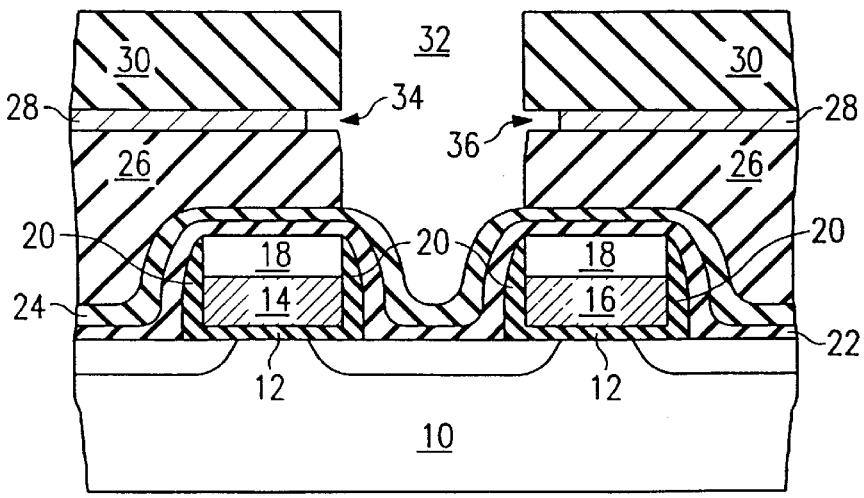
FIG. 3 illustrates an undercut conducting layer according to the teachings of the present invention.

As shown in FIG. 3, the conducting layer 28 is undercut with an isotropic etch. A suitable etch for a polysilicon conducting layer 28 is a wet chemical etch such as a CHOLINE etch. As another example a plasma etch, such as with $SF_6$ may be used. As shown in FIG. 3, this etch results in undercut areas 34 and 36.

Figure 4:
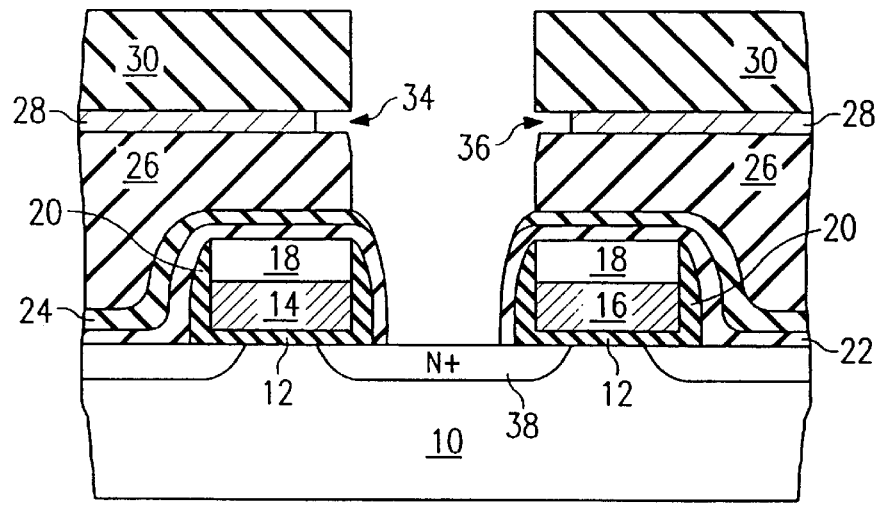
FIG. 4 illustrates subsequent etching after the conducting layer undercut according to the teachings of the present invention.

After forming the undercut areas 34 and 36, another etch is performed to expose the desired contact area on the substrate 10. This etch is shown in FIG. 4, and should be with an etch suitable for etching through the etch stop layer 24 and any other underlying layers, such as layer 22, without etching through to the gates 14 and 16, so as to avoid shorting. Such an etch, for example, is a plasma etch. As shown in FIG. 4, the desired contact area on substrate 10 may be a doped drain region such as that shown by reference numeral 38. It should be understood, however, that the contact area need not be at the face of the substrate 10, but can be in other layers overlying or underlying the substrate as well. The present invention is suitable for contacting in single-level and multi-level integrated circuits.

Figure 5:
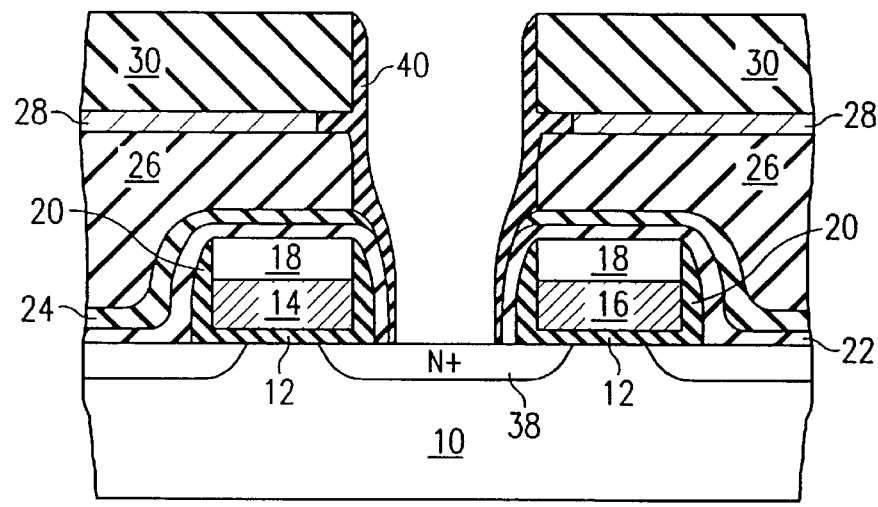
FIG. 5 illustrates formation of an insulator according to the teachings of the present invention.

As shown in FIG. 5, an insulating layer 40 is formed along the inner surface of contact hole 32. This insulating layer 40 provides insulation between conducting layer 28 and the contact that will fill contact hole 32. Insulating layer 40 may be a sidewall oxide deposited on the inner surface of contact hole 32, for example with chemical vapor deposition. It should be understood that this insulator may be any other insulating layer suitable for insulating conducting layer 28 from the contact that will fill contact hole 32, and thus may be, for example, a nitride layer. After forming insulating layer 40, another blanket etch may be required to reopen the contact area at the bottom of the contact hole 32.

Figure 6:
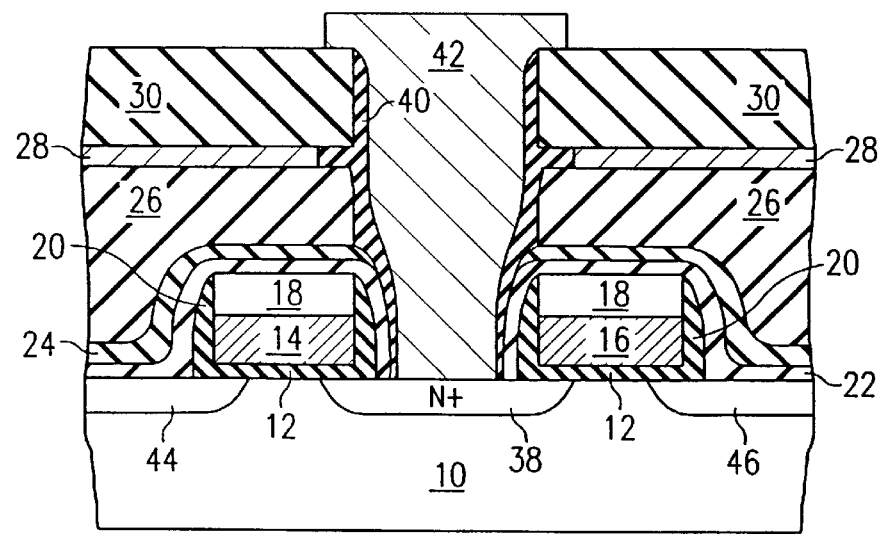
FIG. 6 illustrates formation of a contact in the contact hole according to the teachings of the present invention.

FIG. 6 illustrates formation of a self-aligned contact 42 within contact hole 32. Contact 42 may be of any suitable contact material, such as aluminum or tungsten, among others. Contact 42 may then be patterned and etched on top of BPSG layer 30 for any desired connections. FIG. 6 shows that the portion of contact 42 within contact hole 32 does not extend over gates 14–16.

As can be seen from the preceding FIGUREs, the contact hole 32 and contact 42 are self-aligned with the conduction layer 28, since they are formed directly through the conduction layer 28. Therefore, no patterning and etching of the conduction layer 28 is needed to make room for the contact hole 32, thus avoiding alignment problems in locating the contact hole 32. Thus, narrow spacing and increased device density are allowed with the present invention. Furthermore, by undercutting the conducting layer 28 after forming the self-aligned contact hole, significant insulation is possible between the conducting layer 28 and the contact 42.

A particular application for the present invention is in connection with DRAMs. With such an application, for example, the contact 42 may be a bitline contact to drain region 38. The gates 14 and 16 are coupled to wordlines. Doped sources 44 and 46 are coupled to capacitors, plates of which are formed by conducting layer 28.

Figure 7:
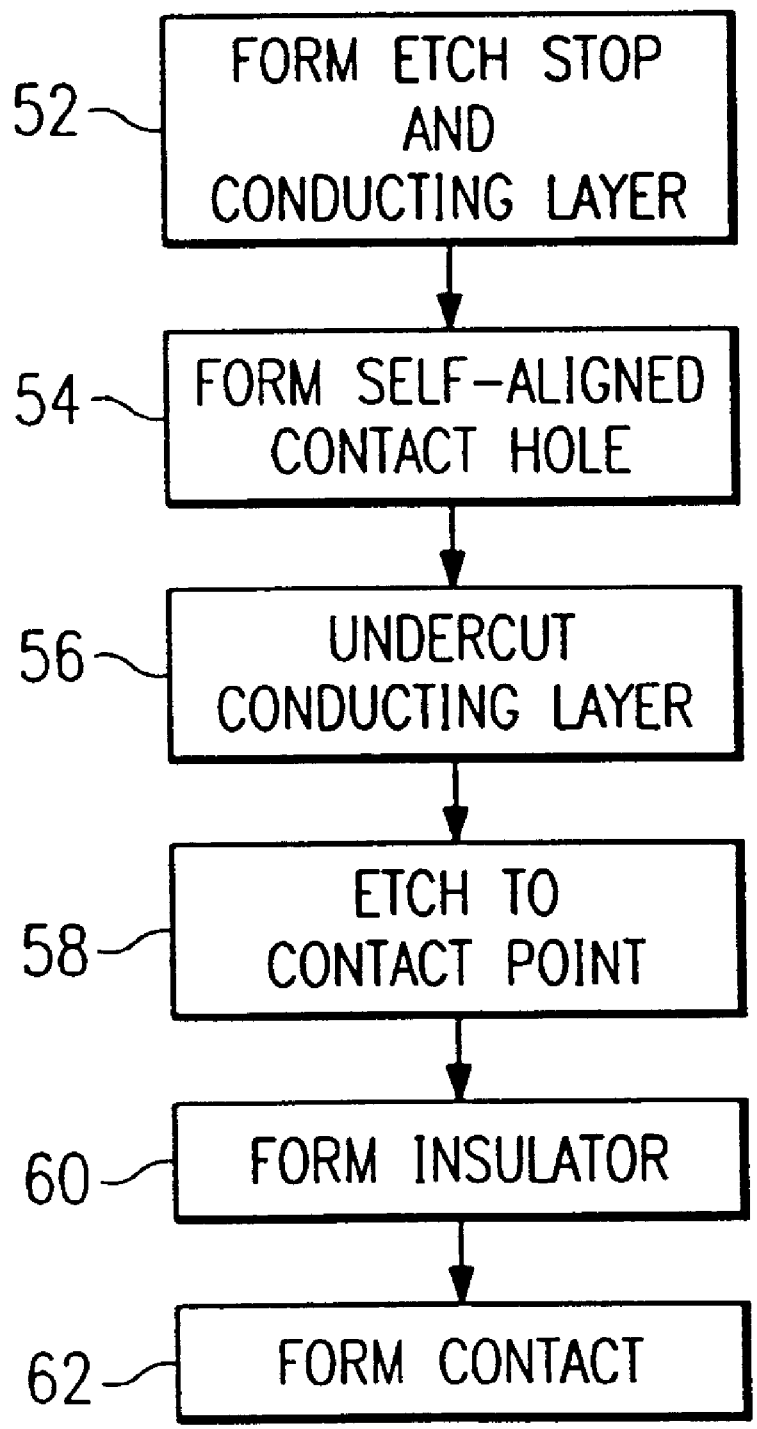
FIG. 7 illustrates a flow diagram of the present invention.

FIG. 7 illustrates a flow diagram of the processing steps discussed above in connection with FIGS. 1–6. As shown in FIG. 7, an etch stop layer and conducting layer are formed at step 52. After forming these layers, the self-aligned contact hole is formed through the conducting layer down to the etch stop layer at step 54. At step 56, the conducting layer is undercut, as discussed above in connection with FIG. 3. Next, at step 58, the contact area is exposed through a subsequent etch. After exposing the contact area, an insulator is formed at step 60 along the inside surface of the contact hole to insulate the conducting layer from the contact. It should be understood that the steps 58 and 60 may be reversed without departing from the intended scope of the present invention. At step 62, the contact is formed within the contact hole.

As discussed above, the process of the present invention allows self-alignment of the contact hole with conducting layers, thereby eliminating problems associated with alignment of contact holes and conducting layers.

Furthermore, it should be understood that although the present invention has been discussed in connection with contacting through to a substrate surface, the present invention may be used to contact to any contact area, whether it be on a substrate surface or another layer in a multi-layer device. Furthermore, the contact area may be any area desired to be contacted, such as a terminal of an active component, an interconnect, or a ground structure, among others.

Although the present invention has been described in detail, it should be understood that various substitutions, alterations, or modifications can be made to this description without departing from the intended scope of the present invention as defined by the appended claims.

What is claimed is:

1. An integrated circuit contact structure, comprising:
   (a) first and second insulated gates at the surface of a substrate;
   (b) sidewall insulators on said first and second gates, said sidewall insulators made of a first material;
   (c) a doped region in said substrate at said surface and located between said gates;
   (d) a conductive layer spaced from and overlying said gates, said conductive layer having an opening over said doped region and extending over a portion of each of said gates; and
   (e) a contact extending from said doped region through said opening to a higer level than said conductive layer, with the portion of said contact in said opening not extending over any portion of said gates.

2. The contact structure of claim 1, wherein:
   (a) said conductive layer is a capacitor plate for memory cell capacitors coupled by said gates to said doped region and contact.

3. The contact structure of claim 1, further comprising:
   (a) an etch stop layer between said gates and said conductive layer and completely overlying said gates, said etch stop layer made of a second material, said second material different from said first material.

* * * * *